US005612692A

United States Patent [19]

Dugas et al.

[11] Patent Number: 5,612,692

[45] Date of Patent: Mar. 18, 1997

[54] FULL TRAVEL, SEALED, FULLY BACKLIGHTED KEYBOARD

[75] Inventors: Roger A. Dugas, Chester; James E. Respaut, Hampstead, both of N.H.; Peter K. Rhoads, Stowe, Mass.

[73] Assignee: Hewlett-Packard Company, Palo Alto, Calif.

[21] Appl. No.: 555,351

[22] Filed: Nov. 8, 1995

Related U.S. Application Data

[63] Continuation of Ser. No. 253,475, Jun. 3, 1994, abandoned.

[51] Int. Cl.[6] .................. H03K 17/94

[52] U.S. Cl. .................. 341/22; 200/5 R; 200/5 B; 345/168

[58] Field of Search .................. 341/20–23; 200/314, 200/302, 159 A, 159 B, 5 A, 5 L, 5 R, 5 B; 345/168; 364/709.1, 709.11, 709.12

[56] References Cited

U.S. PATENT DOCUMENTS

| | | | |
|---|---|---|---|
| 3,890,480 | 6/1975 | Berling et al. | 400/479 |
| 3,898,421 | 8/1975 | Suzumura | 200/5 A |
| 3,941,953 | 3/1976 | Mission et al. | 201/5 R |
| 4,000,389 | 12/1976 | Mission et al. | 200/292 |
| 4,021,630 | 5/1977 | Taylor | 200/5 R |
| 4,056,701 | 11/1977 | Weber | 200/5 A |
| 4,081,898 | 4/1978 | Taylor, Jr. et al. | 200/5 A |
| 4,292,516 | 9/1981 | Nelson | 250/229 |
| 4,314,112 | 2/1982 | Mission et al. | 200/5 A |
| 4,339,634 | 7/1982 | Weber | 200/5 A |
| 4,352,968 | 10/1982 | Pounds | 200/302 |
| 4,367,380 | 1/1983 | Larson et al. | 200/5 R |
| 4,430,531 | 2/1984 | Wright | 200/5 A |
| 4,471,189 | 9/1984 | Bacon et al. | 340/365 R |
| 4,489,227 | 12/1984 | Lamarche | 200/314 |
| 4,491,692 | 1/1985 | Lee | 341/22 |
| 4,500,758 | 2/1985 | Guckenheimer | 200/5 A |
| 4,536,625 | 8/1985 | Bebie | 200/5 A |
| 4,644,326 | 2/1987 | Villalobos et al. | 200/5 A |
| 4,677,268 | 6/1987 | Nemeth et al. | 200/513 |
| 4,758,701 | 7/1988 | Nagel | 200/314 |
| 4,772,769 | 9/1988 | Shumate | 200/314 |
| 4,796,007 | 1/1989 | Heys, Jr. | 341/31 |
| 4,806,908 | 2/1989 | Krupnik | 341/22 |
| 4,809,126 | 2/1989 | Burkman et al. | 361/212 |
| 4,814,561 | 3/1989 | Kawasaki | 200/513 |
| 4,913,387 | 4/1990 | Tice | 244/918 |
| 4,918,445 | 4/1990 | Bower | 341/26 |
| 4,937,408 | 6/1990 | Hattori et al. | 200/314 |
| 4,952,761 | 8/1990 | Viebrantz | 200/513 |
| 5,015,829 | 5/1991 | Eilert et al. | 235/1 D |
| 5,089,690 | 2/1992 | Okamura | 235/145 R |
| 5,138,119 | 8/1992 | Demeo | 200/5 A |
| 5,149,923 | 9/1992 | Demeo | 200/5 A |
| 5,172,805 | 12/1992 | Gumb | 200/341 |
| 5,212,356 | 5/1993 | English | 200/513 |
| 5,228,561 | 7/1993 | Schroeder et al. | 200/517 |
| 5,514,843 | 5/1996 | Wilfong et al. | 200/5 R |

FOREIGN PATENT DOCUMENTS

| | | |
|---|---|---|
| 0351992 | 1/1990 | European Pat. Off. . |
| 2602609 | 2/1988 | France . |
| 4107841 | 9/1992 | Germany . |
| 8503595 | 8/1985 | WIPO . |

OTHER PUBLICATIONS

European Search Report—Sep. 12, 1995.

Syhil P. Parker, McGraw Hill Dictionary of Chemical Terms, 1985, p. 339.

*Primary Examiner*—Thomas Mullen
*Assistant Examiner*—Ashok Mannava

[57] ABSTRACT

A backlighted, full travel, sealed keyboard. A translucent membrane is disposed between the keys and a printed circuit board and includes a gasket around its perimeter which is sealingly engaged by the housing for the keyboard. Domes for each key are formed integrally with the membrane, so that a liquid tight seal is formed between the keys and the printed circuit board. The keyboard is backlighted with LEDs disposed on the printed circuit board. The domes are configured to allow full travel for each of the keys so that a desired tactile feedback is provided to the user.

15 Claims, 8 Drawing Sheets

FULL TRAVEL, SEALED, FULLY BACKLIGHTED KEYBOARD

CROSS REFERENCE TO RELATED APPLICATION

This is a continuation of application Ser. No. 08/253,475 filed on Jun. 3, 1994, now abandoned.

FIELD OF THE INVENTION

This invention relates generally to keyboards, and more particularly to keyboards which are sealed against liquid entry, which permit full travel of the individual keys, and in which each key is backlighted, and which are particularly suited for medical ultrasound apparatus.

BACKGROUND OF THE INVENTION

A wide variety of keyboards are known for use in typewriters, calculators, data entry terminals, remote control terminals and the like. Many of such keyboards employ relatively large keys with relatively large on-center spaces. Often these keys are complex in construction and operate not only to make switch contact, but to provide an operator with a tactile sensation or feedback, whereby the operator is assured of having made switch contact. Such switches employ a wide variety of structures ranging from spring loaded assemblies to dome-type switch elements to provide this tactile feedback signal. Many of such keyboards provide backlighting of the individual keys, so that the keyboard may be used in a darkened environment. Commonly, backlighting is provided by individual light emitting diodes (LEDs) associated with each of the keys. Moreover, it is desirable to provide status indicator lights for some of the keys. Such status indicator lights frequently are not mounted on moveable keys but are positioned adjacent to their associated keys.

For many keyboards, liquid spillage and debris falling into the keyboard are serious problems. Liquids will normally drain down around the key systems and into the keyboard structure itself. Such liquids may be damaging as the liquid may interfere with the optical channels and, in a backlighted keyboard, block passage of the light. Moreover, there is always the problem of liquids shorting out the circuits in the keyboard. These problems are particularly acute for keyboards utilized with medical equipment, such as medical ultrasound.

A problem that frequently arises in medical ultrasound applications is that the operator is required to operate the keyboard immediately after applying an electrically conductive gel to the patient. Occasionally, the gel is not completely removed from the operator's hands and a residue is left on the individual keys of the keyboard. Also, there is a possibility that other undesirable contaminants may be transferred to the keys of the keyboard by the operator's hands and fingers. For these reasons, it is desirable to be able to wash the keyboard easily and completely without damaging the underlying circuitry.

A tactile feedback through "over-travel" of the keys has been determined to be desirable in a keyboard. This "over-travel" effect renders the keyboard ergonomically more desirable by being less tiring to use. Also, the user is reassured that the key stroke has produced the desired effect.

Difficulties have been encountered in the past in developing a keyboard which provides the desired tactile feedback through a full travel key, is completely sealed against liquid penetration, and also provides the desired backlighting and status indicator lights. Often, the provision of a light pipe for a status indicator or lights for backlighting requires penetration of a membrane which otherwise would seal the keys from the underlying printed circuit board or other electrical connections. These areas of penetration provide opportunities for liquids to seep into the electrical connections. Also, in the past, some difficulty has been encountered in providing backlighting in conjunction with full travel keys. Finally, most existing backlighted keyboards cannot be easily cleaned without risking damage to the electrical circuitry.

SUMMARY OF THE INVENTION

The present invention relates to a sealed, full travel, backlighted keyboard which has a large variety of applications, but which is particularly suited for use in conjunction with medical apparatus. The keyboard of this invention can be readily separated from the underlying printed circuit board to permit complete washing and sterilization of the keys.

In the present invention, these results are achieved by the use of a unitary light translucent, flexible membrane which is typically formed of silicon rubber. Molded integrally with this membrane are a plurality of domes, one dome for each key, and a peripheral gasket. Each dome is configured to provide the desired tactile feedback to its associated key. The membrane covers the entire printed circuit (PC) board disposed below the individual keys, and the gasket resides in a slot formed in the keyboard housing so that a liquid tight seal is formed between the PC board and keys. Each key has a hollow core, a transparent upper surface, an opaque skirt and a depression or catch basin for liquids. Disposed beneath each dome and aligned with each key are at least two LEDs. Light from the LEDs passes through the translucent dome and is visible through the transparent upper surface of the key to provide illumination of any indicia on the upper surface.

In another aspect of the invention, selected keys may contain a status indicator which includes a narrow angle, high intensity light source. The moving portion of the key includes a light pipe molded into its clear core. The light pipe is sized and located to intercept and gather light from the source and direct the light to a desired location on the upper surface of the key. The light pipe is configured to allow for full travel of the key. In one embodiment, the upper surface of the key incorporates a molded fresnel lens to allow for easy viewing of the light from the status indicator from the top and side of the key.

In a further aspect of the invention, each individual key is snap fit into the keyboard to permit easy removal and replacement. Moreover, the entire keyboard assembly is snap fit into a housing to permit removal of the entire keyboard for repair, replacement, cleaning and, if necessary, sterilization thereof. When the keyboard has been removed, the underlying membrane and the integrity of the seal around the electrical components remain undisturbed. Should water or other fluid remain on the keyboard when it is replaced after washing, the water will not in any way interfere with the operation of the keyboard.

In another further aspect of the invention, a stabilizer bar is provided in conjunction with the spacer bar to allow use of a somewhat smaller dome with the elongated spacer bar without pivoting of the spacer bar about an axis perpendicular to its length.

BRIEF DESCRIPTION OF THE DRAWINGS

The objects, advantages and features of this invention will be more clearly appreciated from the following detailed description when taken in conjunction with the accompanying drawings, in which.

DETAILED DESCRIPTION

Figure 1:
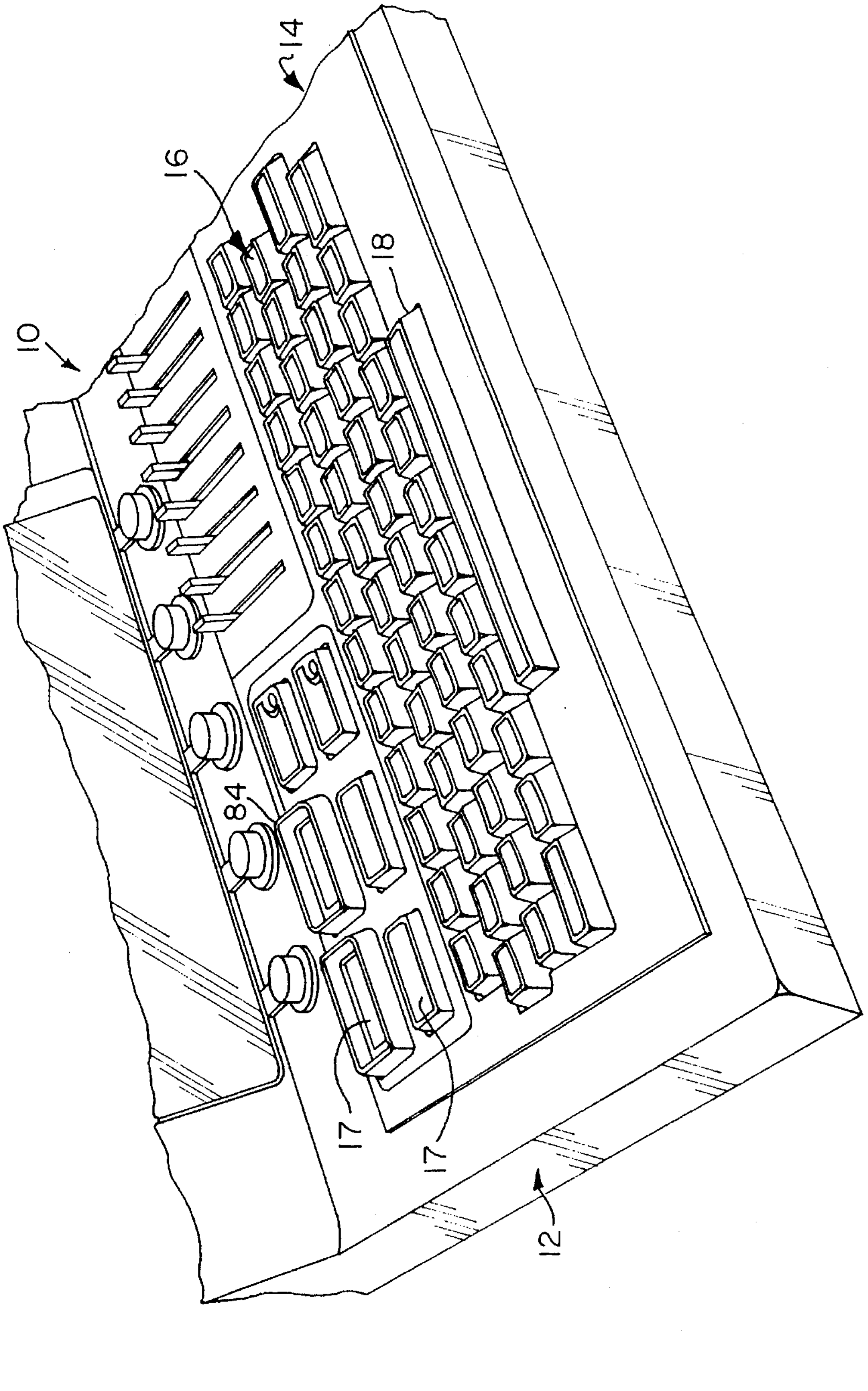
FIG. 1 is a partial, perspective view of the keyboard assembly of this invention.

With reference now to the drawings, and more particularly, to FIGS. 1–3 and 7 thereof, the keyboard assembly 10 of this invention will now be described. Keyboard assembly 10 represents a keyboard which can be used with any conventional system, such as a computer, word processor, calculator, data entry terminal, control panel and the like. In a preferred embodiment, the keyboard assembly of this invention is particularly suited for use with a medical ultrasound system or some other microprocessor controlled medical or industrial system in which contamination is a problem due to the working environment or due to materials borne by the hands of the user, such as an electrically conductive gel used in medical ultrasound. Moreover, the keyboard assembly 10 of this invention also is particularly suited for medical and other applications in which it is required to operate the assembly in a darkened environment.

Keyboard assembly 10 comprises housing 12; keyboard panel 14 having individually moveable keys 16, function keys 17 and a spacer bar 18; membrane 20; spacer board 22; mother PC board 24; and, in some applications, daughter PC board Keyboard panel 14 may have the characteristics of a typewriter or word processor. Keys 16 may be in a rectangular matrix or in a staggered (offset) matrix as are typewriter keys. All of keys 16 and 17 are located on panel 14 which has an excess capacity of key locations and is easily expandable to add other keys.

Panel 14 is removable from housing 12 and has an outer perimeter which is snap-fit within a comparably sized opening 28 in housing 12. Panel 14 is retained within opening 28 therein by conventional snaps 30 which engage housing 12. The ability to remove panel 14 allows panel 14 and its associated keys 16 and 17 and spacer bar 18 to be repaired, replaced, washed, sterilized or otherwise cleaned without fear of damaging the circuitry contained on mother board 24 or daughter board 26.

One or more snaps 30 may be disposed at various locations around the edge of panel 14. Preferably, two snaps 30 are provided along a front edge of panel 14 adjacent spacer bar 18, a single snap 30 is provided along one edge of panel 14 along a right side as shown in FIG. 1, another snap 30 is provided along a left side of panel 14 as shown in FIG. 1, and another snap 30 is provided along a top edge of panel 14 adjacent function keys 17, as shown in FIG. 1. However, more or fewer snaps 30 may be provided as desired.

Figure 7:
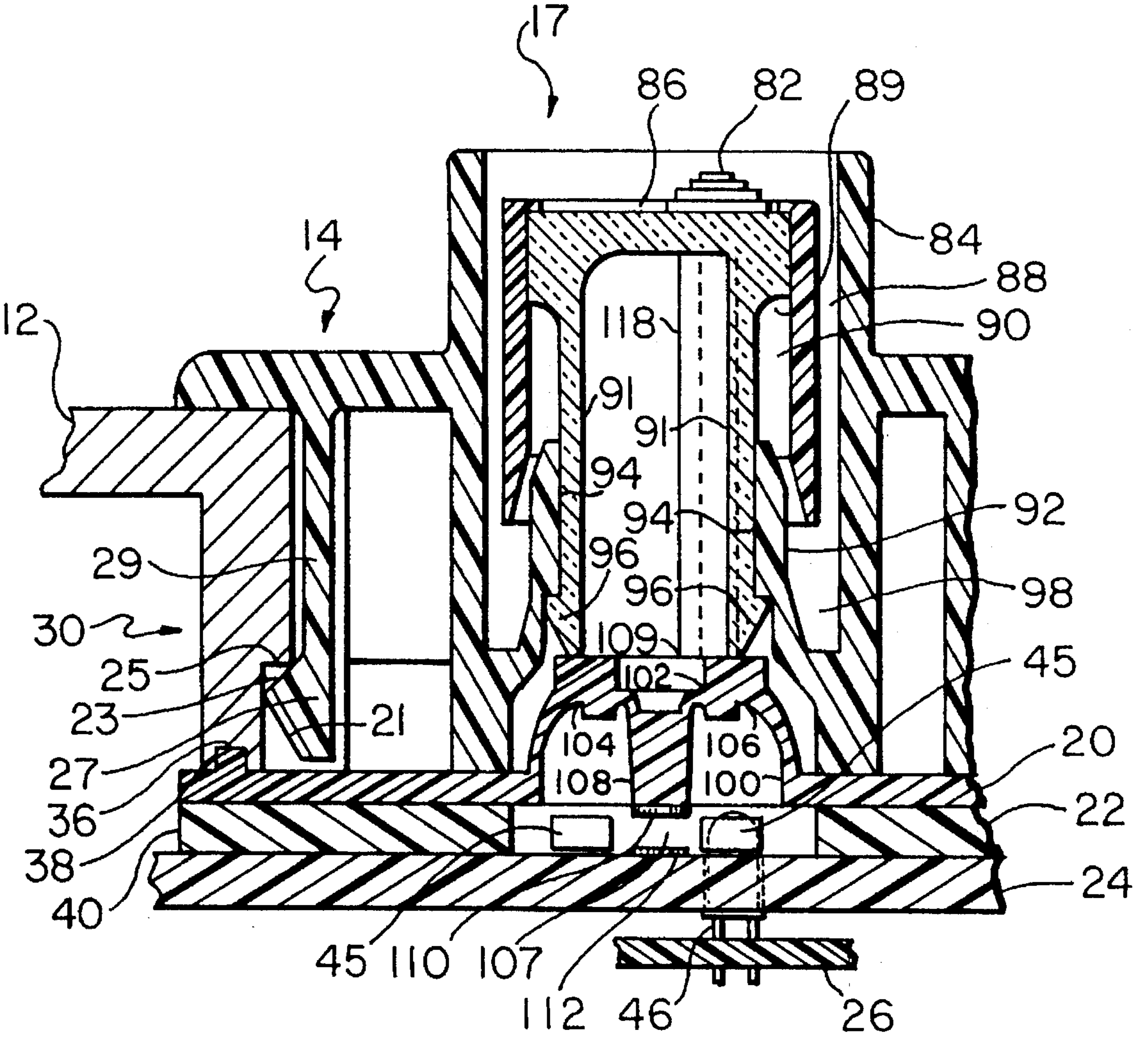
FIG. 7 is a cross-sectional side view of the function key of FIG. 5.

A typical snap 30 will now be described with particular reference to FIG. 7. Each snap 30 includes a flexible, resilient finger 29 attached only at its proximal end to panel 14 and having a projection 27 disposed adjacent an unattached, distal end thereof. Projection 27 is adapted to engage a shoulder 25 formed on the interior surface of housing 12. Projection 27 has a slanted lower surface 21 and a beveled upper surface 23. To insert panel 14 into housing 12, panel 14 need only be pushed downwardly. Lower surface 21 rides over the edge of housing 12 and causes finger 29 to deflect inwardly away from housing 12 as finger 29 slides downwardly along an inner surface of housing 12. As finger 29 approaches membrane 20, surface 23 of projection 27 is urged into engagement with shoulder 25 as finger 29 returns to its original position due to its resilience. For removal, upper surface 23 rides over shoulder 25 upon the application of a sufficient upward force, causing finger 27 to deflect inwardly. Surface 23 typically forms about a 45° angle with respect to the direction of elongation of finger 29, while surface 21 typically forms about a 60° angle with respect to the direction of elongation of finger 29.

Disposed directly below panel 14 is translucent or transparent membrane 20. Membrane 20 is formed integrally with a plurality of domes 32 and 33, one dome 32 being associated with each key 16 and one dome 33 being associated with each key 17. An integrally formed gasket 34 extends around the outer perimeter of membrane 20. Domes 32 and 33 and gasket 34 are molded with membrane 20 when membrane 20 is formed so that there are no seams whatsoever on the surface of membrane 20 through which liquids or gases could penetrate.

Membrane 20 also includes a plurality of holes 13 around its edges outside gasket 34 through which screws (not shown) extend to secure membrane 20 to the underside of housing 12. When assembled, gasket 34 extends into a correspondingly formed slot 36 in the edge of housing 12 (see FIG. 7). Gasket 34 has an enlarged head 38 and a narrowed stem 40. As a result, as membrane 20 is secured to housing 12, head 38 expands outwardly towards the interior sides of slot 36 to enhance the seal. In this way, a watertight seal is formed between the perimeter of membrane 20 and housing 12.

Figure 3:
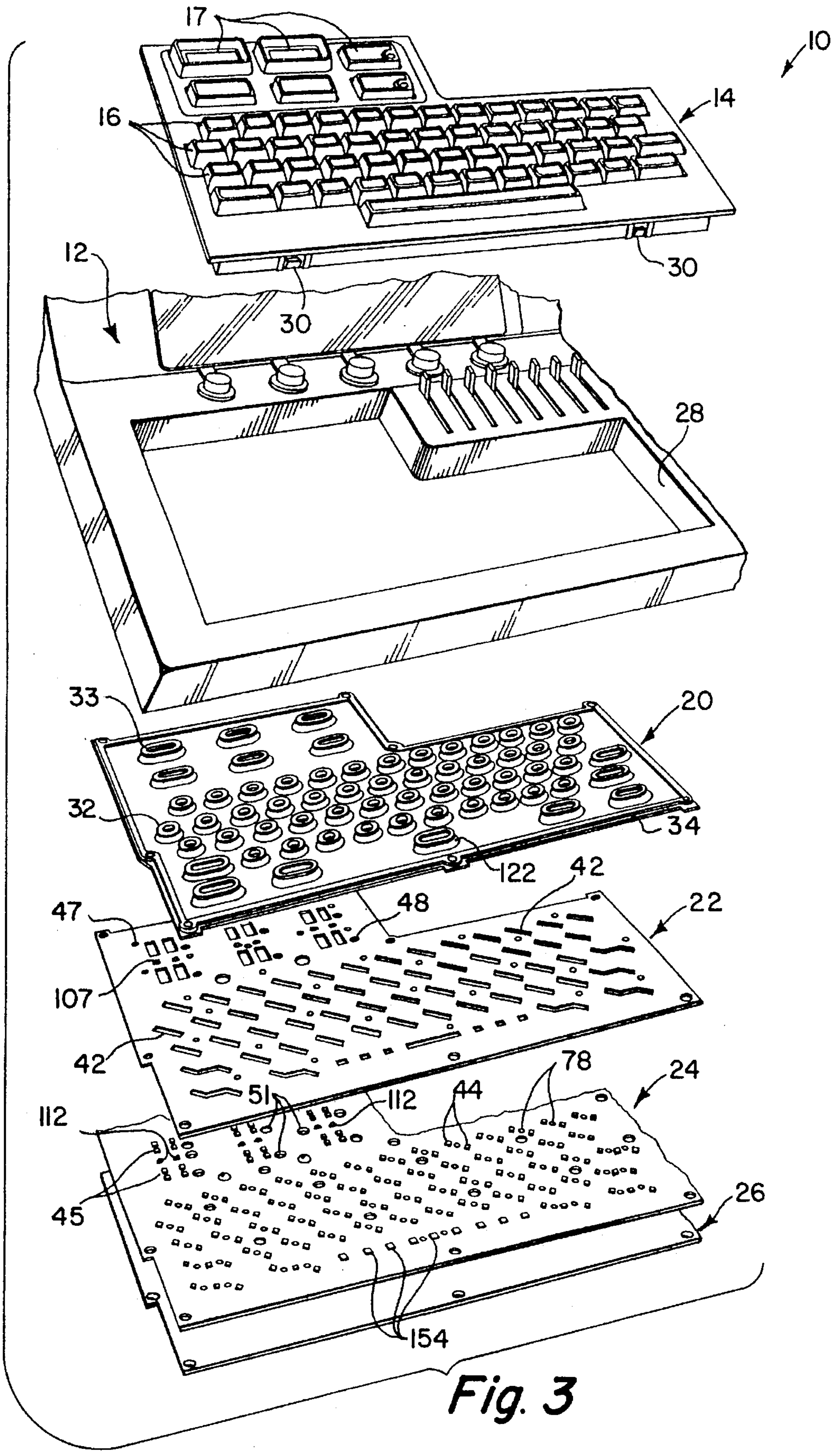
FIG. 3 is an exploded, perspective view of the keyboard assembly of FIG. 1.

Disposed directly below membrane 20 is a spacer board 22, a non-electrically conductive board which separates mother PC board 24 from membrane 20. Spacer board 22 contains a plurality of openings 42, 47 and 48. Each opening 42 is associated with one key 16. Openings 42 permit electrical contact between surfaces on domes 32 of membrane 20 and electrical contact lands 78 on PC board 24. In addition, openings 42 allow for the use of LEDs 44 or the like for illumination of keys, as will be described. Openings 42 typically are aligned at about a 45° angle with respect to the width direction of panel 14 as shown in FIG. 3, for reasons that will become apparent below. Opening 48 and a plurality of openings 47 are associated with each function key 17. Openings 47 allow for use of LEDs 45 with each key 17, while opening 48 is associated with a status indicator LED 46.

Disposed directly below spacer 22 is the mother PC board 24 which contains all of the decoding and electronic circuitry necessary for the keyboard. In addition, board 24 also contains contact lands 78 which, in one embodiment, comprise interdigitating comb patterns or the like which are electrically interconnected by depression of a key 16 or 17. Board 24 also carries the LEDs 44 and 45 for illumination of keys 16 and 17 respectively. LEDs 44 and 45 typically are low profile LEDs which provide a low intensity light suitable for backlighting. Typically, to provide the desired uniformity and intensity of illumination, two LEDs 44 are provided for each key 16 and four LEDs 45 are provided for each key 17. Two LEDs 44 are aligned with each associated opening 42 in spacer board 22 to allow passage of the light from LEDs 44 through board 22 and to an associated dome 32. However, it is to be understood that a single LED or other light source may be used for both keys 16 and 17, as long as the desired level of uniformity and intensity is achieved.

In one embodiment, disposed below mother board 24 is a daughter board 26. Typically, daughter board 26 carries LEDs 46 (FIG. 7) which comprise the status indicator lights for function keys 17. Greater illumination is required for status indication, so that larger LEDs and different configurations are required than for LEDs 44. Board 26 permits the use of larger LEDs by providing the required vertical clearance. However, it is to be understood, that if lower profile LEDs are used which provide the desired illumination for the status indicators, LEDs 46 may be mounted on mother board 24, and the provision of daughter board 26 would be obviated. Each LED 46 is associated with an opening 48 in spacer board 22 and an opening 51 in board 24 to allow passage of light from LEDs 46 into associated domes 33 on membrane 20.

As previously indicated, one dome 32 is associated with each source key 16, while one dome 33 is associated with each rectangular function key 17. Typically, domes 32 are generally circular in cross-section, while domes 33 are elongated to accommodate the larger size of the function keys 17. The size of the dome should be such that the dome provides a generally uniform upward force and uniform support for its associated key across the entire base of the key, to prevent the key from becoming twisted or out of alignment, which ultimately could cause binding of the key and prevent its smooth movement.

Figure 4:
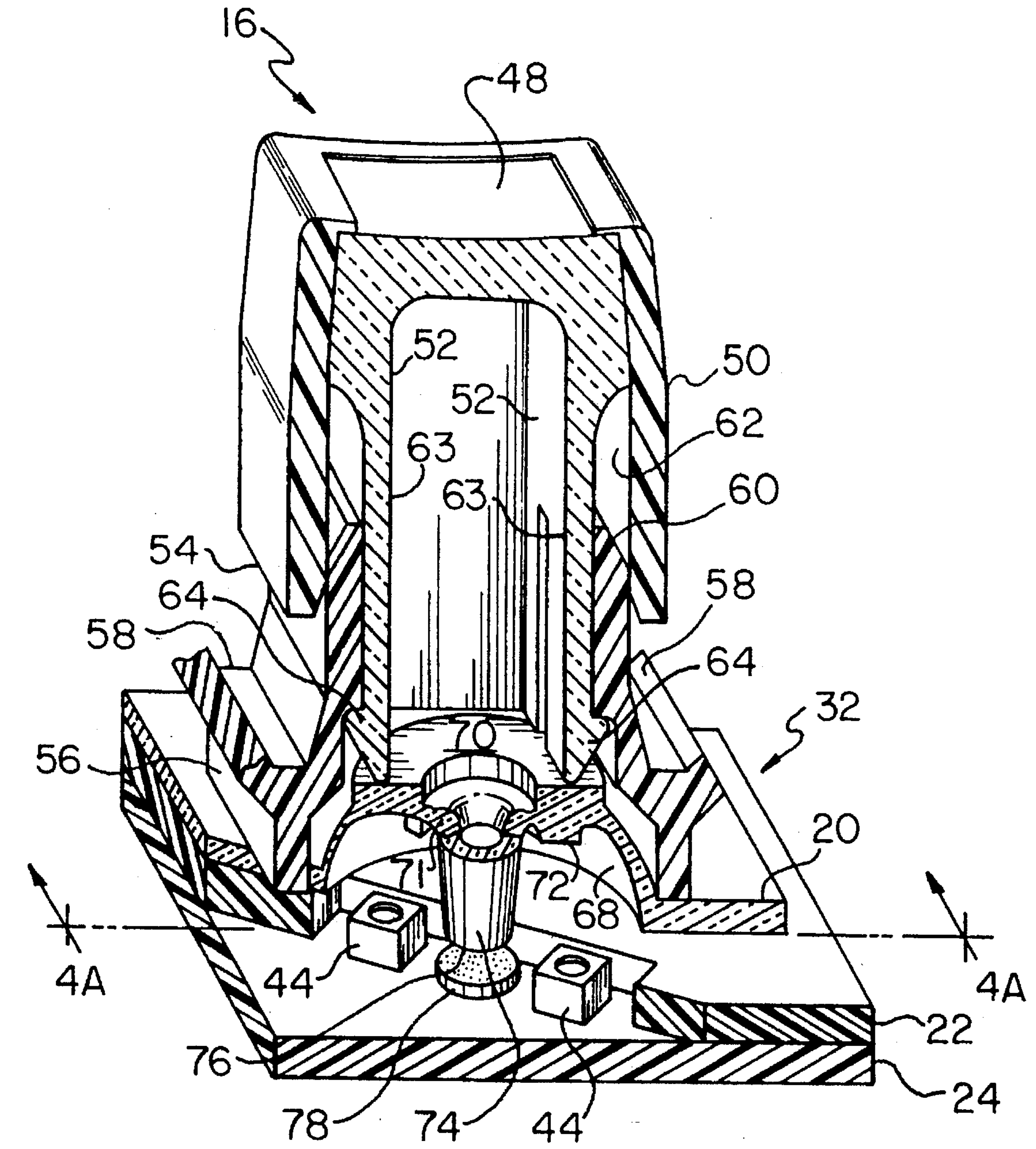
FIG. 4 is a partially cutaway, cross-sectional perspective view of one switch element of the assembly of FIG. 1 in a raised position.
Figure 4A:
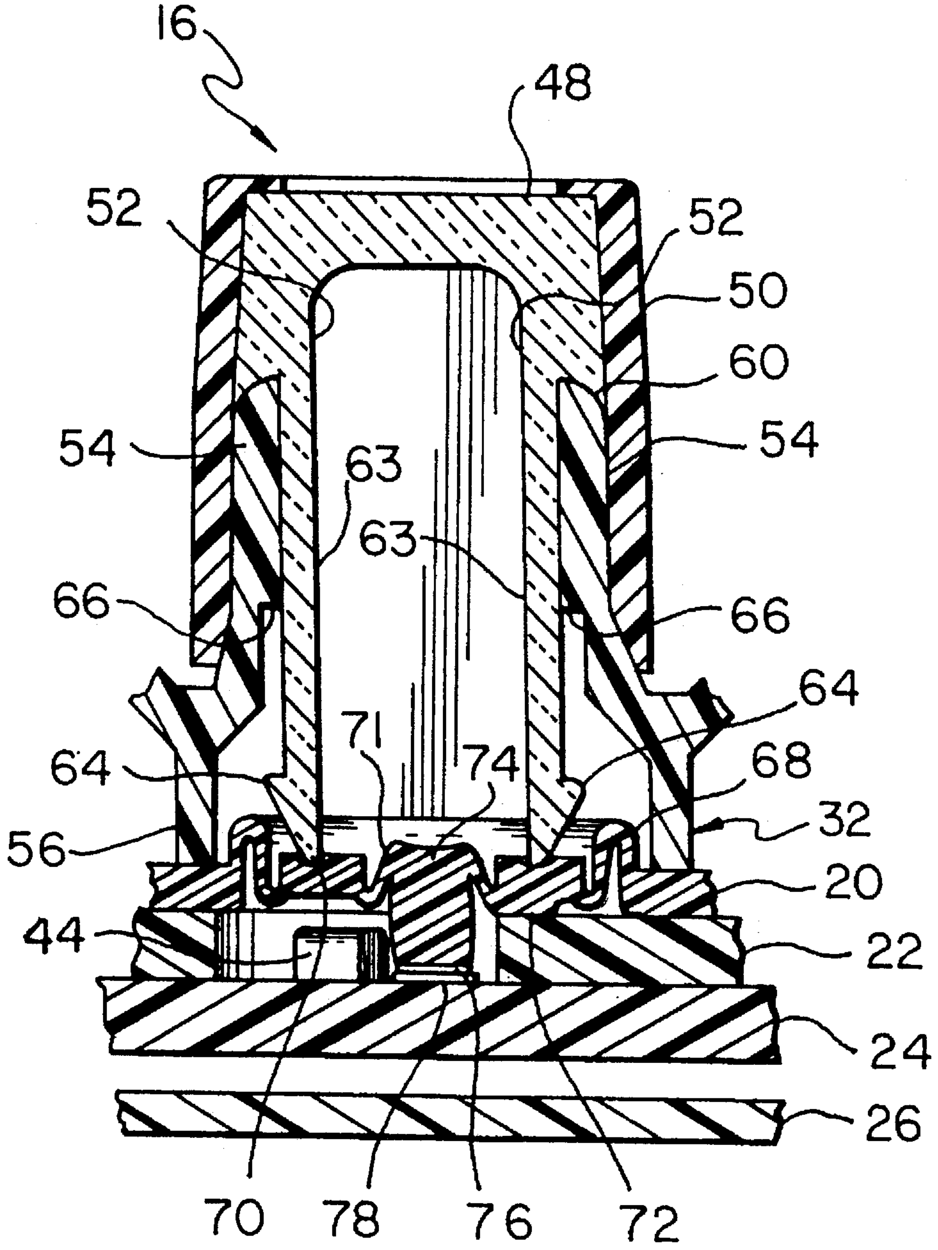
FIG. 4A is a partial, cross-sectional side view of the switch element of FIG. 4 in a fully depressed position.

A typical key 16 and its associated dome 32 will now be described with particular reference to FIGS. 4 and 4A. Each key 16 includes an upper surface 48 having light transparent regions, an opaque skirt 50 and sidewalls 52. Sidewalls 52 may be transparent or opaque or translucent. The center of each key 16 is hollow. Molded into keyboard panel 14 and associated with each key 16 are vertical walls 54 which enclose a hollow area in their center. Walls 54 are supported by lower portions 56 which rest on membrane 20. Disposed between adjacent walls 54 are depressions or catch basins 58 which are adapted to collect any liquids which roll off skirt 50. The level of the liquid in depressions 58 would have to rise above the upper tip 60 of walls 54 before there is any risk that the liquid would flow down to the membrane. Walls 54 are configured so that walls 52 of key 16 ride therealong in closely spaced relation for guiding vertical movement of key 16. Space 62 between skirt 50 and walls 52 accommodates walls 54 during vertical movement of key 16.

Each key 16 includes a pair of opposed fingers 63 having projections 64 on their distal ends. Fingers 63 are formed in walls 52 and are attached to associated walls 52 only at their proximal ends. Fingers 63 are flexible and resilient, like fingers 29. Disposed on the inner surface of walls 54 are a pair of shoulders 66, each of which is aligned with and engaged by an associated projection 64 to limit the vertical movement of keys 16 in an upward direction away from membrane 20, as shown in FIG. 4. However, shoulders 66 do not limit the downward movement of key 16 toward membrane 20. Key 16 can be removed by flexing fingers 63 inwardly to release projections 64 from shoulders 66. Similarly, key 16 can be replaced by pressing key 16 downwardly to cause walls 52 to slide down along walls 54 to produce flexing of fingers 63 until projections 64 snap into place below shoulder 66. In this manner, key 16 can be removed for repair, cleaning, or replacement.

Light from LEDs 44 shines through membrane 20 and through the hollow center of key 16 to upper surface 48. If desired, an alphanumeric indicator (not shown) may be placed on upper surface 48. Typically, since regions of upper surface 48 are light transparent, an alphanumeric indicator is formed by rendering opaque the areas around the number or letter to define the number or letter. In this manner, as light from LEDs 44 shines through surface 48, only the number or letter is visible and the remainder of upper surface 48 is opaque. A coating typically is painted or otherwise applied to upper surface 48 to define the alphanumeric indicator. However, it is to be understood, that other known techniques for forming an alphanumeric indicator may be used, such as a paper or plastic mask secured to surface 48 and outlining the numbers or letters. Also, opaque alphanumeric indicators may be applied, which become visible when light from LEDs 44 shines through the surrounding clear regions of upper surface 48.

Dome 32 will now be described with particular reference to FIGS. 4 and 4A. Dome 32 typically includes a lower flexible web 68, an upper flexible web 71, an upper support ring 70, lower stops 72 and projection 74. Upper support ring 70 extends around the entire perimeter of dome 32 and wall 52 and supports the lower edge of wall 52 of key 16. When key 16 is depressed, the lower edge of wall 52 presses downwardly equally and symmetrically on dome 32 so that dome 32 flexes or deforms downwardly uniformly around its entire cross-section. Projection 74 contains an electrically conductive surface 76 such as a carbon loaded pill on its lower distal end, on a side of membrane 20 facing board 24. Surface 76 contacts associated land 78 on board 24 when projection 74 is sufficiently depressed to interconnect the interdigitating fingers to produce the desired switching effect. Stops 72 are aligned generally orthogonally of the direction of elongation of opening 48 in board 22 and are positioned so that stops 72 are not directly over opening 48. Thus, when dome 32 is depressed, stops 72 engage a surface of board 22 and not LEDs 44 or board 24. Dome 32 is configured to provide a desired "over-travel" by matching dome 32 to a predetermined force/displacement curve. It is understood that the size and thickness of webs 68 and 71 can be adjusted to conform to any selected force/displacement curve.

An elongated projection 74 is preferred because it allows the use of board 22 which in turn creates the clearance necessary to permit the placement of LEDs 44 on board 24 along with lands 78 and other circuitry. If a shorter projection 74 were used, it would be impossible to use board 22, and because of the size of LEDs 44, LEDs 44 would have to be placed on another board, such as board 26 to provide the required clearance. This configuration, as shown in FIG. 4, permits a more efficient use of board space and simplifies the electrical circuitry design.

In operation, when key 16 is depressed, initially lower web 68 deforms, allowing support ring 70 and projection 74 to travel downwardly toward board 24 in a uniform manner. Projection 74 continues to travel downwardly until surface 76 strikes associated land 78. At this point, continued downward force on key 16 causes both web 71 and web 68 to deform, permitting support ring 70 to continue in a downwardly direction toward board 24 while projection 74 remains stationary. Continued deformation of web 71 permits support ring 70 to continue downwardly until stops 72 strike the upper surface of board 22. Stops 72 prevent any further downward movement of key 16. In this manner, an produced after surface 76 strikes land 78 to provide to the operator the desired tactile.

Upon removal of a downwardly directed force on key 16, the natural resiliency of web 68 and 71 cause upper support ring 70 to again rise upwardly until web 71 returns to its original configuration. Thereafter, the natural resiliency of lower web 68 lifts projection 74 and further lifts support ring 70 along with key 16 until lower web 68 has returned to its original configuration. At this time, key 16 has been returned to its original, raised condition as shown in FIG. 4. Dome 32 urges projections 64 of fingers 63 against shoulders 66 to insure that key 16 is always returned to the same raised position with respect to the other keys 16 on the keyboard. Preferably, dome 32 is always slightly deformed when projections 64 engage shoulders 66, so that dome 32 maintains an upwardly directed force on key 16 to maintain registration between projections 64 and shoulders 66.

Figure 4B:
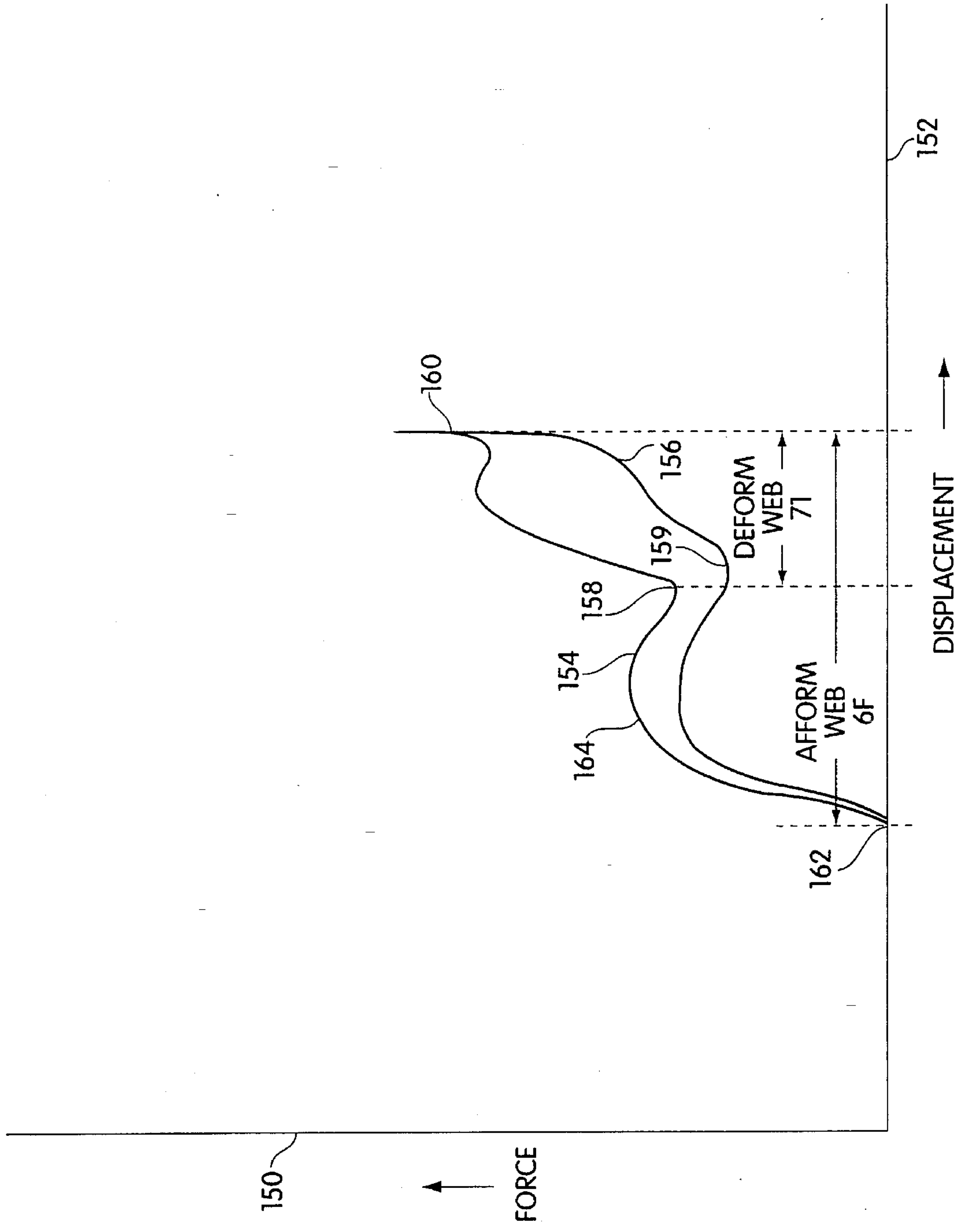
FIG. 4B is a plot of a force versus displacement curve for a typical switch element of FIGS. 4 and 4A.

FIG. 4B illustrates typical force/displacement curves 154 and 156 for an exemplary key 16 and its associated dome 32. It is understood, however, that the curves represented by FIG. 4B are intended to be illustrative only and that the invention is not limited to a configuration with these particular force/displacement curves. In FIG. 4B, the ordinate represents a force in grams which is applied to surface 48 in a downwardly direction, while the abscissa represents the vertical displacement in millimeters from a reference point of a typical key 16. At position 162, the applied force is zero, and key 16 is at its normally raised position at a predetermined distance from a fixed reference point. As greater downward force is applied, the downward displacement from the reference point increases along curve 154 as web 68 is deformed. At point 164 on curve 154, web 68 effectively "snaps over", or ring 70 passes beyond a point in the deformation of web 68 where further displacement occurs with a lesser amount of applied force. In one exemplary embodiment, the maximum applied force at this point is about 75 plus or minus 19 grams. Further displacement occurs until point 158 on curve 154 is reached. At point 158, conductive surface 76 on projection 74 contacts its associated land 78 on board 24. At point 158, in an exemplary embodiment, the applied force is approximately 22 to 45 grams less than at point 164. Thereafter, the application of additional force causes deformation of both web 68 and web 71. As can be seen, greater force is required to deform webs 68 and 71 than to deform only web 68. At point 160 on curve 154, stops 72 are in engagement with board 22, and the application of additional force produces little or no additional displacement. At point 160, in one typical embodiment, the applied force is about 130 grams. In one embodiment, the total distance traveled by key 16 from point 162 to point 160 on curve 154 is about 3.1 milimeters and the total distance traveled from point 162 to point 158 on curve 154 is about 1.85 milimeters.

Once key 16 has reached point 160 on curve 154, a reduction in applied force causes the key to return to its raised condition along curve 156. As force is reduced, the key returns to point 159 on curve 156, at which time web 71 has returned to its normal condition, as shown in FIG. 4. Thereafter, ring 70 rises up as dome 32 "snaps over", and web 68 continues to return to its normal configuration as shown in FIG. 4, between point 159 and point 162 on curve 156. At point 159 on curve 156, the minimum return force is about 25 grams in one exemplary embodiment. As can be seen, the force/displacement curve 154 is different from the force/displacement curve 156 as a result of hysteresis in the deformation of dome 32.

Figure 6:
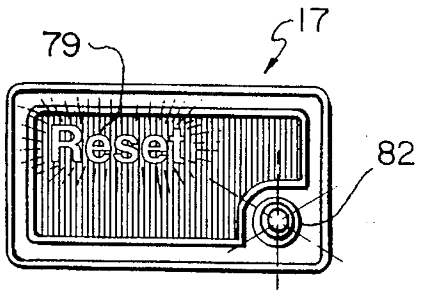
FIG. 6 is a top plan view of the function key of FIG. 5.
Figure 5:
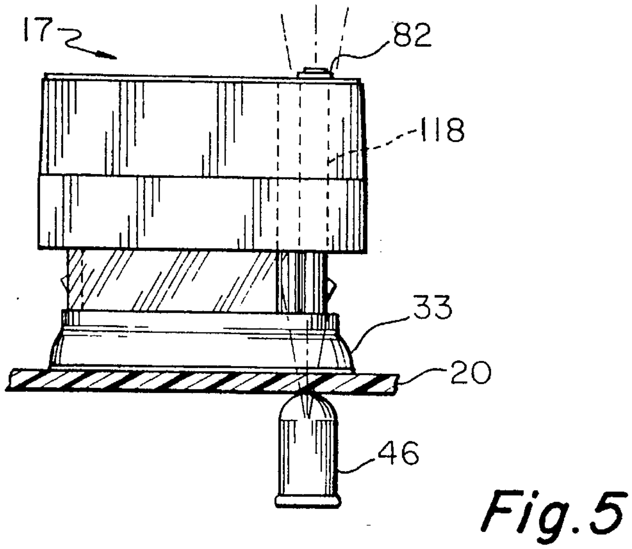
FIG. 5 is a side, elevation view of a function key of the assembly of FIG. 1.
Figure 2:
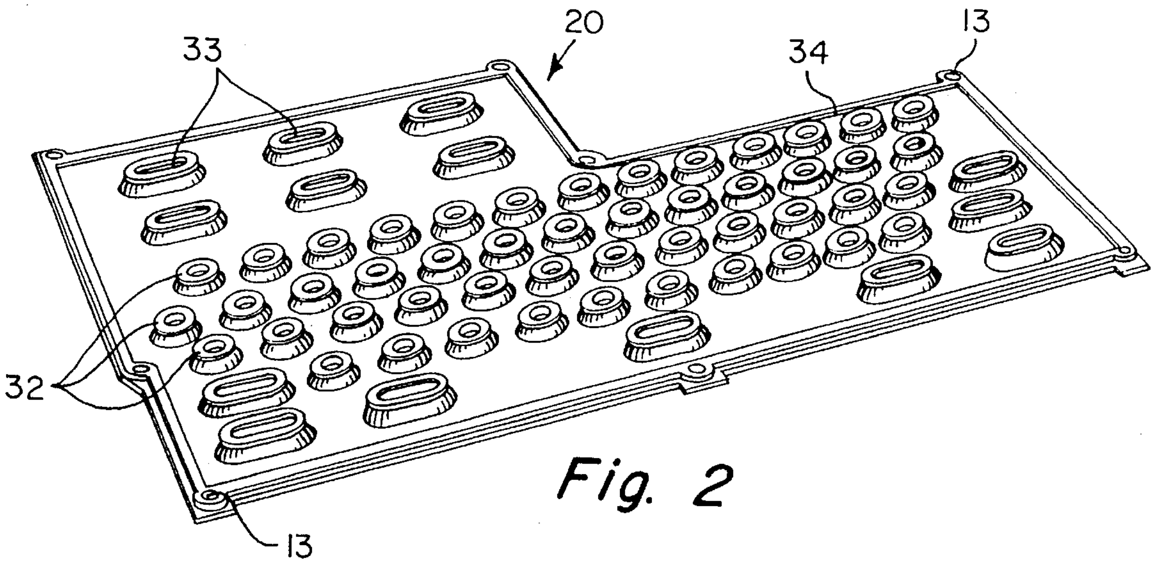
FIG. 2 is a perspective view of the membrane of the assembly of FIG. 1.

A typical function key 17 will now be described with particular reference to FIGS. 5–7. Function keys 17 differ from keys 16 in that keys 17 have a status indicator light 82, and therefore are rectangular in cross-sectional shape rather than being square in cross-sectional shape as are keys 16. As a consequence, each dome 33 is similarly elongated to provide uniform support for the entire lower surface of associated key 17. Typically, although not necessarily, housings 84 are molded into panel 14 and at least some keys 17 are surrounded by a housing 84.

Each key 17 includes a light transparent upper surface 86, an opaque skirt 88 and downwardly extending sidewalls 90. Sidewalls 90 may be opaque, transparent or translucent. Molded into panel 14 are upwardly extending walls 92 which enclose an open space. For each key, two opposed flexible, resilient fingers 91 are formed in sidewalls 90, and each finger 91 has a projection 96 formed on a distal end. Each finger 91 is attached to walls 90 only at a proximal end. Walls 92 contain a pair of opposed shoulders 94, each of which is in alignment with and is adapted to engage an associated projection 96. As with keys 16, walls 92 are configured to have substantially the same cross-sectional size and shape as the cross-sectional size and shape of sidewalls 90 so that sidewalls 90 travel along and are guided by walls 92. Space 89 between walls 90 and skirt 88 accommodates walls 92. Projections 96 and associated shoulders 94 limit the upward travel away from membrane 20 of key 17, and projections 96 are maintained in engagement with shoulders 94 by a constant deflection of dome 33. As with keys 16, keys 17 may be removed by depressing fingers 91 inwardly to release projections 96 from shoulders 94. Similarly, key 17 may be replaced simply by depressing key 17 them to cause flexing of fingers 91 inwardly as projections ride along walls 92 until projections 96 snap into position beneath shoulders 94. A depression 98 is disposed between adjacent walls 92, or between walls 92 and the walls of associated housing 84 to collect any liquids that may roll off skirt 88 of a key 17.

Dome 33 is substantially similar to dome 32, except that dome 33 is elongated to conform to the elongated shape of key 17. Dome 33 includes a lower web 100, an upper web 102, support ring 104, two stops 106, two projections 108, and a conductive surface 110 disposed on the lower end of each projection 108. Each conductive surface 110 is on a side of membrane 20 facing board 24 and is adapted to contact associated land 112 to complete a switching function, as previously described. Typically, although not necessarily, four LEDs 45 are provided for illumination of each key 17. Each LED 45 has an associated opening 47 in board 22 and LEDs 45 typically are arranged in a rectangular pattern which is aligned with the rectangular shape of key 17. Projections 108 extend through openings 107 in board 22 between LEDs 45. Stops 106 engage an upper surface of board 22 between LEDs 45. Preferably, stops 106 are centrally disposed on dome 33 with respect to the long side of the rectangle formed by key 17 while projections 108 are centrally disposed on dome 33 with respect to the short side of the rectangle formed by key 17.

In operation, as key 17 is depressed, web 100 deforms and projections 108 travel downwardly toward board 24 until surfaces 110 contact associated lands 112. Further downward force deforms web 102 and continues to cause ring 104 to move downwardly until stops 106 engage the upper surface of board 22 to limit downward travel. Release of a downward force causes web 102 and web 100 to return key 17 in an upwardly direction away from board 24 until projections 96 engage shoulders 94. Light from LEDs 45 travels up the hollow central core of key 17 to illuminate upper surface 86 of key 17. An alphanumeric indicator 79 may be utilized on upper surface 86 in the same manner as key 16.

Function keys 17 also include a status indicator display 82. Typically, display 82 is either illuminated to indicate that the switch is operational, or is not illuminated to indicate an off-status. This invention differs from some prior art systems in that status indicator display 82 is disposed on the key itself, rather than being alongside the key. Key 17 includes a light pipe 118 which extends from display 82 down toward membrane 20 to the lower edge of walls 90. The lower end 109 of light pipe 118 is in contact with or closely adjacent to ring 104 of dome 33. Typically, light pipe 118 is molded as part of the clear core of key 17 and is formed of a solid, transparent, light conducting, plastic material. Aligned with the lower end 109 of light pipe 118 is a narrow angle, high intensity light source, such as LED 46. Typically, LED 46 is of such a size and shape that it must be mounted on board 26 to provide the required clearance. LED extends through a corresponding opening 51 in board 24. However, if LED 46 were to be sufficiently flat and still provide the desired high intensity light, it could be mounted on mother board 24. LED 46 is electrically coupled to lands 112 to reflect the status condition of the switch associated with key 17. Light from LED 46 shines through opening 48 in board 22 and through dome 33 to be received by lower end 109 of light pipe 118. Light pipe 118 transmits light from LED 46 along its length to display 82 disposed on upper surface 86. Preferably, although not necessarily, display 82 includes a fresnel lens to allow easy viewing from the top and sides of the key 17.

Figure 8:
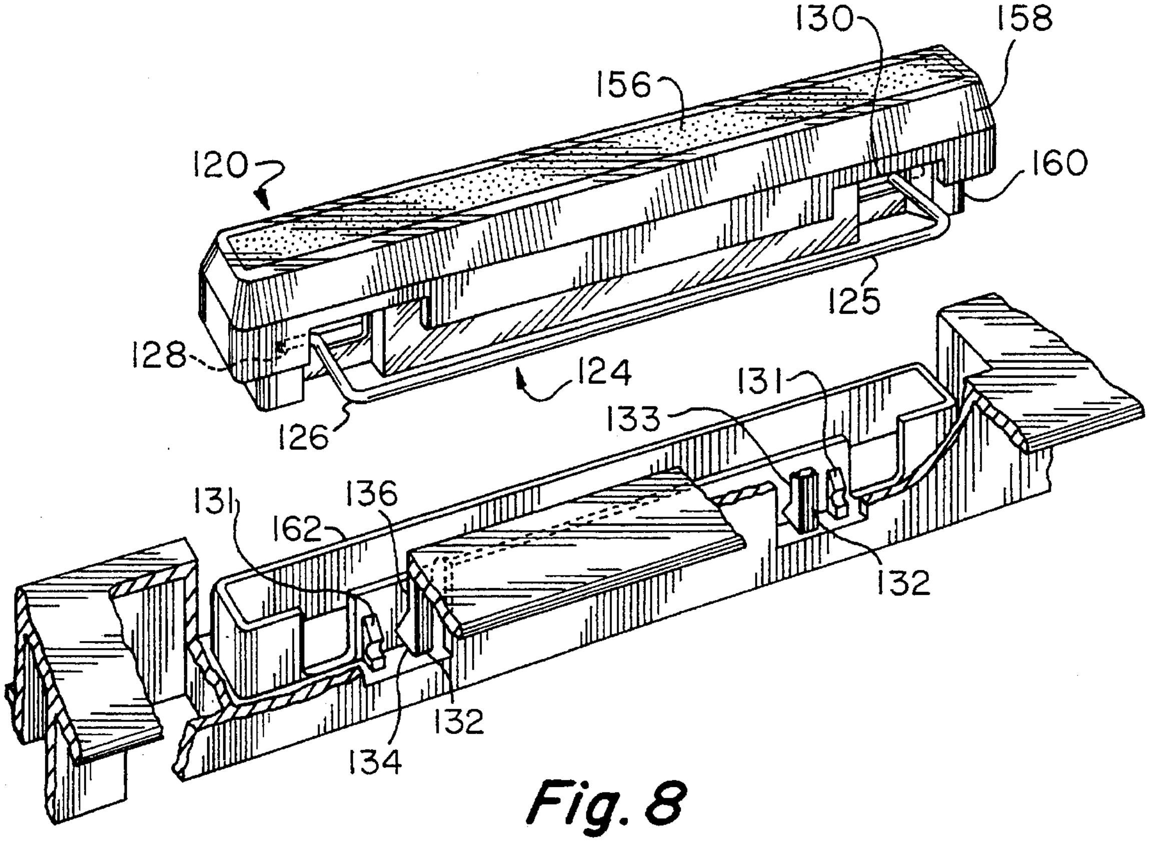
FIG. 8 is an exploded, perspective view of the spacer bar switch assembly of the keyboard assembly of FIG. 1.
Figure 9:
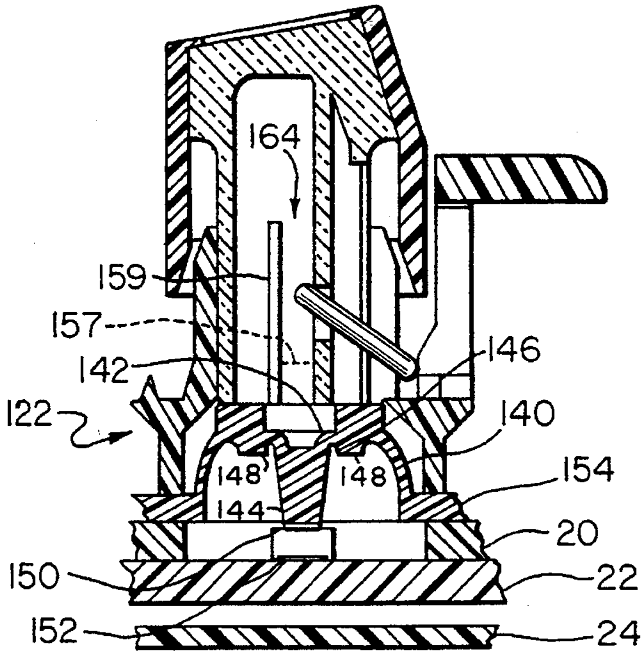
FIG. 9 is a cross-sectional end view of the spacer bar switch assembly of FIG. 8.

Another aspect of the present invention, spacer bar 120, and associated dome 122, will now be described with particular reference to FIGS. 8 and 9. Spacer bar 120 includes light transparent upper surface 156, opaque skirt 158 and walls 160 which may be transparent, translucent or opaque. Molded into panel 114 are vertical walls 162 along which walls 160 ride and which guide the movement of walls 160. As with key 17, disposed at each end of spacer bar 120 is a flexible finger 164 which includes a projection which engages an associated shoulder 159 molded into walls 162 for limiting the upward travel of spacer bar 120 and for permitting removal of spacer bar 120 upon deflection of fingers 164.

The structure of dome 122 is similar to that of dome 33. Dome 122 includes lower web 140, upper web 142, two projections 144, support ring 146 and two stops 148. Electronically conductive surfaces 150, which typically include carbon loaded pills, contact associated lands 152 to produce the desired switching function. Two LEDs 154 may be provided on board 24 beneath dome 122 for illumination of spacer bar 120. Additional LEDs 154 are disposed along the length of spacer bar 120.

It is preferred that dome 122 not extend along the entire length of spacer bar 120. Such a dome would be more difficult to manufacture, and would be inherently unstable, as one end would not necessarily be depressed the same amount and at the same rate as the other end. To provide the desired stability to spacer bar 120 and to permit the use of a dome which is limited in length, a stabilizer bar 124 is provided. Stabilizer bar 124 prevents rocking of spacer bar 120 or pivoting of spacer bar 120 about an axis perpendicular to its direction of elongation. Bar 124 comprises a rod 125 which is elongated in the direction of elongation of spacer bar 120. Bar 124 also includes transverse portions 126 which extend generally perpendicularly of the direction of elongation of rod 125 and mounting ends 128 which extend from portions 126 in a direction generally parallel to the direction of elongation of rod 125. Portions 126 extend through slots 130 formed in spacer bar 120, and are sufficiently resilient that they can be temporarily deformed during the insertion process to allow ends 128 to pass through slots 130. After insertion, the resiliency inherent in portion 126 urges ends 128 beyond the ends of slot 130 to prevent ends 128 from being pulled out of slots 130.

Rod 125 is held in position in housing 12 by complementary snaps 132 and slots 131. Preferably, two such complementary snaps 132 and slots 131 are provided. Each snap 132 comprises a resilient finger 134 with a slot 136 adapted to receive rod 125. Slot 131 is disposed opposite slot 136 but preferably is offset therefrom. When installing rod 125, fingers 132 are deflected away from slots 131 by rod 125 as rod 125 presses downwardly on a slopped upper surface 133 of finger 134. Deflection of finger 134 allows rod 125 to pass into slots 131 and 136. Finger 134, due to its spring bias, retains rod 125 in slots 131 and 136. For removal of rod 125, finger 134 is deflected away from slot 131 sufficiently to allow rod 125 to be lifted out of slots 131 and 136.

In operation, as spacer bar 120 rises and falls, rod 125 remains substantially stationary, but pivots about an axis extending along rod 125 parallel to its length. Portions 126 are sufficiently long that they are permitted to slide in and out of slots 130 to accommodate the rise and fall of bar 120, but ends 128 prevent total withdrawal of portions 126 from slots 130. Slots 130 are sufficiently wide to accommodate pivotal movement of rod 125. However, rocking of spacer bar 120 about an axis perpendicular to its direction of elongation is not permitted, since bar 124 is retained against such movement by slots 131 and 136. Any downward force on spacer bar 120 at any location will cause the entire bar to be depressed uniformly along its length.

The foregoing invention provides a keyboard assembly which is backlighted, which includes an over-travel provision for each of the keys, and in which the electronics are protected from the keyboard by a liquid tight seal. Moreover, status indicator lights are provided on certain function keys, and the entire keyboard, including individual keys, can be temporarily removed for cleaning and sterilization. Finally, a stabilizer bar permits utilization of this invention with an elongated spacer key. Most of the components may be molded from plastic, although other suitable materials may be employed. Typically, membrane 20 is composed of silicon rubber having a durometer of about 50.

In view of the above description, it is likely that modifications and improvements may occur to those skilled in the art which are within the scope of this invention. The above description is intended to be exemplary only, the scope of the invention being defined by the following claims and their equivalents.

What is claimed is:

1. A keyboard adapted to be fixedly secured in a housing, comprising:

a removable panel having a plurality of keys, said keys having an upper surface having a light translucent region;

a board having electrical circuitry, including contact lands;

a translucent membrane disposed between all of said keys on said panel and said board and forming a liquid tight seal between said panel and said board, said membrane comprising:

a main body, a plurality of flexible, resilient domes formed integrally with said main body, one dome being associated with each of said keys, and a gasket integrally formed with said main body of said membrane and extending around a perimeter of said membrane, said gasket configured to be received by a correspondingly formed channel in the housing to provide a liquid-tight seal between said membrane and the housing, wherein said main body, said gasket and said domes form a continuous, seamless, unitary membrane adapted to operate with the housing to form a water impermeable barrier between said board and said panel;

a source of illumination disposed on said board, light from said source of illumination passing through said domes on said membrane and through said upper surface of said keys; and an electrically conductive surface associated with each of said domes and disposed on a side of said membrane facing said board, depression of a key on said keyboard causing deformation of an associated dome to urge said electrically conductive surface of said associated dome into contact with an associated one of said lands on said board.

2. The keyboard as recited in claim 1, wherein each of said keys comprises a hollow interior for allowing light to pass from said source of illumination through said upper surface of said key.

3. The keyboard as recited in claim 1, further comprising:

a status indicator display disposed on said upper surface of at least one of said keys;

a light pipe having a lower end and extending from an associated dome of said one of said keys to said status indicator display on said upper surface of one of said keys; and a dedicated source of light disposed on said board directly below said lower end of said light pipe, said dedicated source of light being selectively illuminated in response to a status of said one of said keys.

4. The keyboard as recited in claim 1, wherein said source of illumination comprises two light emitting diodes associated with each of said keys.

5. The keyboard as recited in claim 1, wherein each of said domes comprises:

a portion for supporting an associated one of said keys;

a first web interconnecting said portion with a main body of said membrane;

a projection extending downwardly toward said board, said projection having an electrically conductive surface on a lower end thereof and on a side of said membrane facing said board; and a second web interconnecting said portion and said projection, depression of an associated key causing deformation of said first web and movement of said projection toward an associated contact land on said board, further depression of said associated key after said electrically conductive surface touches said associated contact land causing deformation of said second web and movement of said portion toward said board.

6. The keyboard as recited in claim 1, further comprising guide walls surrounding each of said keys and wherein each of said keys comprises a pair of spaced, opposed, flexible fingers having a projection on a distal end for engagement with shoulders on said guide walls for limiting upward travel of said keys and for allowing each of said keys to be removed from said panel by deflection of said fingers.

7. The keyboard as recited in claim 1 further comprising:

a housing to which said board and said membrane are secured; and a plurality of flexible resilient fingers disposed on said panel each of said fingers having a projection which removably engages an associated shoulder on said housing to secure said panel to said housing and to allow removal of said panel by deflection of said fingers, said panel being removable independently of said membrane and said board.

8. A keyboard as recited in claim 1 further comprising:

a spacer bar having a length and a direction of elongation;

a dome formed integrally with said membrane and being associated with said spacer bar, said dome being elongated in said direction of elongation of said spacer bar, said dome having a length of elongation less than said length of elongation of said spacer bar;

a stabilizer bar, said stabilizer bar having two ends extending into slots formed in said spacer bar; and a clasp disposed on said panel for restraining said stabilizer bar, said clasp preventing movement of said stabilizer bar and said spacer bar about an axis perpendicular to said direction of elongation.

9. A keyboard comprising:

a housing having a top surface and a lower surface;

a board having electrical circuitry including contact lands on a face and being secured to said lower surface of said housing;

a removable panel having a plurality of keys, each of said keys having a stop limiting upward travel of said keys, light translucent regions in an upper surface and a hollow interior, said panel being removably mounted to said top surface of said housing;

a light translucent, unitary, seamless, continuous water impermeable membrane disposed between said board and all of said keys of said panel, said membrane having a main body;

a gasket formed integrally with said body of said membrane and extending around a perimeter of said membrane, said gasket being received by a correspondingly formed channel in said lower surface of said housing to provide a liquid tight seal between said board and said panel;

a plurality of flexible domes formed integrally with said membrane, said domes, said main body of said membrane and said gasket forming a continuous, seamless, unitary, water impermeable barrier between said board and said panel, one of said domes being associated with each of said keys, each of said domes comprising:

an upper support portion upon which a lower edge of an associated key rests, said support portion being urged upwardly against said lower edge of said key;

a first web interconnecting said support portion with said main body of said membrane;

at least one projection extending downwardly from said support portion toward said board, said projection having an electrically conductive surface formed on a side thereof facing an associated contact land on said board;

a second web interconnecting said projection and said support portion, depression of said associated key causing deformation of said first web until said projection contacts said associated contact land, further depression of said associated key producing deformation of said second web; and a stop formed on a lower surface of said support portion for limiting travel of said support portion toward said board; and a light source associated with each of said keys and being mounted on said board, said light source emitting light which passes through an associated dome and through said hollow portion of said associated key and said upper surface of said associated key.

10. The keyboard as recited in claim 9, further comprising:

a second source of illumination associated with at least one of said keys, said second source of illumination being disposed on a same side of said membrane as said board, said second source of illumination being selectively illuminated in response to a status condition of said at least one associated key;

a display on said upper surface of said at least one associated key; and a light pipe disposed within said interior of said keys, for conducting light emitted from said second source of illumination to said display on said upper surface of said at least one associated key.

11. The keyboard as recited in claim 9, wherein said keys are removably secured to said panel.

12. A keyboard adapted to be fixedly secured in a housing, comprising:

a removable panel having a plurality of keys including a plurality of first keys and at least one second key, said first and second keys having an upper surface having a light translucent region;

a board having electrical circuitry, including contact lands;

a translucent membrane disposed between all of said keys on said panel and said board and forming a liquid tight seal between said panel and said board, said membrane comprising:

a main body, a plurality of flexible, resilient domes formed integrally with said main body, one dome being associated with each of said keys, and a gasket formed integrally with said main body and extending around a perimeter of said membrane, said gasket configured to be received by a correspondingly formed channel in said. housing in such a manner as to provide a liquid-tight seal between said membrane and the housing, wherein said main body, said gasket and said domes form a continuous, seamless, unitary membrane adapted to operate with the housing to form a water-impermeable barrier between said board and said panel;

a plurality of first illumination sources disposed on said board, each associated with a particular one of said first and second keys of said board, light from said first illumination source passing through said associated domes on said membrane and through said upper surface of said associated first key;

at least one second illumination source, each associated with one of said at least one second key, said one or more second illumination sources being disposed on a same side of said membrane as said board;

a display on said upper surface of said at least one associated second key;

a light pipe, disposed within said interior of said at least one second key, for conducting light emitted from said associated second source of illumination to said display on said upper surface of said at least one second key; and an electrically conductive surface associated with each of said domes and disposed on a side of said membrane facing said board, wherein depression of a key on said keyboard causes deformation of an associated dome to urge said electrically conductive surface of said associated dome into contact with an associated one of said lands on said board.

13. The keyboard as recited in claim 12, wherein each of said keys comprises a hollow interior for allowing light to pass from said associated one or more illumination sources through said upper surface of said key.

14. The keyboard as recited in claim 12, wherein each of said keys comprises side walls having a catch basin adapted to collect fluids rolling off said keys.

15. The keyboard as recited in claim 12, wherein each of said domes comprises:

a portion for supporting an associated one of said keys;

a first web interconnecting said portion with a main body of said membrane;

a projection extending downwardly toward said board, said projection having an electrically conductive surface on a lower end thereof and on a side of said membrane facing said board; and a second web interconnecting said portion and said projection, depression of an associated key causing deformation of said first web and movement of said projection toward an associated contact land on said board, further depression of said associated key after said electrically conductive surface touches said associated contact land causing deformation of said second web and movement of said portion toward said board, wherein said first and second webs respond to the application of force from said associated one of said keys in accordance with a predetermined force-displacement relationship.

* * * * *